(12) United States Patent
Matsumoto et al.

(10) Patent No.: US 9,391,036 B2
(45) Date of Patent: Jul. 12, 2016

(54) SEMICONDUCTOR DEVICE AND MANUFACTURING METHOD THEREOF

(71) Applicant: Sony Corporation, Tokyo (JP)

(72) Inventors: Katsuji Matsumoto, Kanagawa (JP); Hiizu Ootorii, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/294,242

(22) Filed: Jun. 3, 2014

(65) Prior Publication Data

US 2014/0361431 A1    Dec. 11, 2014

(30) Foreign Application Priority Data

Jun. 11, 2013 (JP) .................................. 2013-122554

(51) Int. Cl.
*H01L 23/00* (2006.01)

(52) U.S. Cl.
CPC ................ *H01L 24/11* (2013.01); *H01L 24/03* (2013.01); *H01L 24/05* (2013.01); *H01L 24/13* (2013.01); *H01L 2224/03009* (2013.01); *H01L 2224/0345* (2013.01); *H01L 2224/0346* (2013.01); *H01L 2224/0347* (2013.01); *H01L 2224/03912* (2013.01); *H01L 2224/0401* (2013.01); *H01L 2224/05009* (2013.01); *H01L 2224/05022* (2013.01); *H01L 2224/0558* (2013.01); *H01L 2224/05124* (2013.01); *H01L 2224/05147* (2013.01); *H01L 2224/05166* (2013.01); *H01L 2224/05541* (2013.01); *H01L 2224/05557* (2013.01); *H01L 2224/05572* (2013.01); *H01L 2224/05647* (2013.01); *H01L 2224/11009* (2013.01); *H01L 2224/1134* (2013.01); *H01L 2224/1146* (2013.01); *H01L 2224/1181* (2013.01); *H01L 2224/11462* (2013.01); *H01L 2224/11472* (2013.01); *H01L 2224/11849* (2013.01); *H01L 2224/11903* (2013.01); *H01L 2224/13006* (2013.01); *H01L 2224/13007* (2013.01); *H01L 2224/13018* (2013.01); *H01L 2224/13082* (2013.01); *H01L 2224/94* (2013.01); *H01L 2924/3651* (2013.01)

(58) Field of Classification Search
CPC ............................... H01L 24/11; H01L 24/13
USPC .......................................... 257/737; 438/614
See application file for complete search history.

(56) References Cited

U.S. PATENT DOCUMENTS

| | | | |
|---|---|---|---|
| 2003/0124832 A1* | 7/2003 | Tseng et al. .................. | 438/613 |
| 2003/0222352 A1* | 12/2003 | Kung et al. .................... | 257/772 |
| 2005/0140004 A1* | 6/2005 | Ishiguri et al. ................ | 257/737 |
| 2007/0141750 A1* | 6/2007 | Iwasaki et al. ................ | 438/108 |
| 2007/0290343 A1* | 12/2007 | Harada et al. ................. | 257/737 |
| 2012/0040524 A1* | 2/2012 | Kuo et al. ...................... | 438/614 |
| 2012/0098124 A1* | 4/2012 | Wu ......................... | H01L 24/11 257/737 |
| 2013/0270715 A1* | 10/2013 | Malatkar et al. .............. | 257/774 |
| 2014/0329382 A1* | 11/2014 | Hwang et al. ................. | 438/614 |

FOREIGN PATENT DOCUMENTS

| | | |
|---|---|---|
| JP | 2008-028112 | 2/2008 |
| JP | 2012-080043 | 4/2012 |

* cited by examiner

*Primary Examiner* — Christine Enad
(74) *Attorney, Agent, or Firm* — Dentons US LLP

(57) ABSTRACT

A semiconductor device includes a first semiconductor electronic component which includes a pad electrode, a solder bump, and a metal layer between a pad and solder that is configured to have an underlying metal layer formed between the pad electrode and the solder bump and connected to the pad electrode, and a main metal layer formed on the underlying metal layer, and in which the main metal layer has an eave portion at an outer edge portion thereof.

12 Claims, 13 Drawing Sheets

SEMICONDUCTOR DEVICE AND MANUFACTURING METHOD THEREOF

CROSS REFERENCE TO RELATED APPLICATIONS

This application claims the benefit of Japanese Priority Patent Application JP 2013-122554 filed Jun. 11, 2013, the entire contents of which are incorporated herein by reference

BACKGROUND

The present technology relates to a semiconductor device and a manufacturing method thereof, and more particularly to a technology field of a semiconductor device in which a predetermined metal layer is disposed between a pad electrode and a solder bump.

For example, as known as a flip chip method and the like, an IC chip (semiconductor chip) is bonded (mounted) onto the mounting substrate including a semiconductor substrate through a solder bump. In the semiconductor device in which a semiconductor chip is mounted on the mounting substrate through the solder bump, an under-bump metal (hereinafter, referred to as "UBM") is disposed between a pad electrode and a solder bump (for example, refer to Japanese Unexamined Patent Application Publication No. 2008-28112 and Japanese Unexamined Patent Application Publication No. 2012-80043). The UBM is provided so as to improve a degree of bonding adhesion between the pad electrode (for example, Al-based material) and the solder bump.

A formation of the UBM is performed, for example, as follows. That is, first, a metal seed layer (underlying metal layer: for example, Cu, Ti, and the like) which is in contact with the pad electrode is formed. A formation of the metal seed layer is performed by PVD (physical vapor deposition) and CVD (chemical vapor deposition) over an entire surface of a wafer in terms of ensuring reliability and the like. Then, a main metal layer made of, for example, Ni and the like is formed on the metal seed layer by electrolytic plating in which the metal seed layer is used as an electrode. The electrolytic plating is performed after a mask which has an opening only at a position corresponding to the pad electrode is processed, and accordingly, the main metal layer is formed to have a predetermined diameter.

The main metal layer formed to have a predetermined diameter as described above and a metal seed layer formed on the underlying side thereof function as the UBM.

Here, the metal seed layer formed on the entire surface of a wafer as described above being left as it is, results in the pad electrodes being electrically connected to each other. Therefore, the metal seed layer is used during the above-mentioned electrolytic plating, and then eventually removes (removes the main metal layer regarded as a mask) a portion protruding from the main metal layer by etching and the like. Etching at this time is performed using isotropic etching such as wet etching and the like.

SUMMARY

However, as pointed out even in Japanese Unexamined Patent Application Publication No. 2008-28112, etching on the above-described metal seed layer proceeds not only in a vertical direction but also in a horizontal direction (side etching), and accordingly, there is a possibility that a removal of the metal seed layer is performed not only at a portion protruding from a main metal layer but also at a lower side of the main metal layer (over-etching: referred to as an undercut in Japanese Unexamined Patent Application Publication No. 2008-28112).

When such an over-etching of the metal seed layer occurs, there is a possibility, for example, that a pad electrode configured to have an Al-based material may corrode, thereby greatly lowering a bonding intensity of the pad electrode. Then, as a result, there is a possibility that reliability of an electrical and mechanical connection between a mounting substrate and a semiconductor chip may be significantly lowered.

In the technology described in Japanese Unexamined Patent Application Publication No. 2008-28112, a technique of oxidizing the metal seed layer and performing etching thereon is adopted so as to prevent over-etching on the metal seed layer (UBM film 7).

However, a very long time (24 hours) is necessary for oxidation processing in the technique, and thereby there is a difficulty in mass productivity, and an increase in cost is inevitable.

It is desirable to prevent the lowering of reliability in an electrical and mechanical connection between semiconductor electronic components while suppressing the lowering of mass productivity and the increase in cost with respect to a semiconductor device in which a predetermined metal layer is disposed between the pad electrode and the solder bump.

According to an embodiment of the present technology, there is provided a semiconductor device, including a first semiconductor electronic component which includes a pad electrode, a solder bump, and a metal layer between a pad and solder that is configured to have an underlying metal layer formed between the pad electrode and the solder bump and connected to the pad electrode, and a main metal layer formed on the underlying metal layer, and in which the main metal layer has an eave portion at an outer edge portion thereof.

By providing the eave portion, an allowance amount of over-etching occurring in an etching process of the underlying metal layer, in which the main metal layer is regarded as a mask, is increased in proportion to a length of the eaves portion.

In the semiconductor device according to the embodiment, it is desirable to include a second semiconductor electronic component which is electrically and mechanically connected to the first semiconductor electronic component through the solder bump.

Accordingly, a semiconductor device is realized, in which the semiconductor electronic components are electrically and mechanically connected to each other through the solder bump.

In the semiconductor device according to the embodiment described above, it is desirable that the metal layer between a pad and solder function as an under-bump metal.

Accordingly, a degree of bonding adhesion between the pad electrode and the solder bump is improved.

In the semiconductor device according to the embodiment described above, it is desirable that a formation pitch of the solder bump be set to 100 µm or less.

The formation pitch of the solder bump becomes a narrow pitch, and thereby the semiconductor device can be made small.

In the semiconductor device according to the embodiment described above, it is desirable that a length of the eaves portion in a protrusion direction be set to 0.1 µm to 2.5 µm.

The length of the eaves portion after etching the underlying metal layer is appropriately set, and thereby stress caused by solder melted during reflow is eased.

According to another embodiment of the present technology, there is provided a method of manufacturing a semiconductor device, including an underlying metal layer formation process which forms an underlying metal layer on the substrate portion so as to be in contact with the pad electrode formed on the substrate portion including a semiconductor substrate, a main metal layer formation process which forms a main metal layer at a position corresponding to a formation position of the pad electrode on the underlying metal layer, a solder layer formation process which forms a solder layer on the main metal layer, and an underlying metal layer etching process which etches the underlying metal layer by regarding the main metal layer as a mask, and in which the main metal layer having an eaves portion at an outer edge portion thereof is formed in the main metal layer formation process.

Accordingly, the etching of the underlying metal layer is performed based on a tip portion of the eaves portion formed on the main metal layer, and an allowance amount of over-etching occurring in the etching is increased in proportion to a length of the eaves portion.

In the manufacturing method of a semiconductor device according to the technology described above, it is desirable to form the main metal layer so that a length of the eaves portion in a protrusion direction is set to 0.5 μm to 5 μm in the main metal layer formation process.

A length of the eaves portion before the etching of the underlying metal layer is appropriately set, and thereby an allowance amount of over-etching occurring in the etching is appropriately set.

In the manufacturing method of a semiconductor device according to the technology described above, it is desirable to perform etching by using a chemical solution which can etch both the underlying metal layer and the eaves portion, and has a slower etching rate on the eaves portion than on the underlying metal layer in the etching of the underlying metal layer.

Accordingly, the eaves portion is also etched when etching is performed on the underlying metal layer.

In the manufacturing method of a semiconductor device according to the technology described above, it is desirable that the underlying metal layer in which the top layer and a layer under the top layer are configured from different materials, respectively, be formed in the underlying metal layer formation process, a mask having an opening at a position corresponding to the formation position of the pad electrode be processed on the underlying metal layer, and etching which selectively removes the top layer of the underlying metal layer with the mask processed be performed and then the main metal layer be formed in the opening in the main metal layer formation process.

Accordingly, the top layer of the underlying metal layer is over-etched to further outside than the opening of a mask. In this state, the main metal layer is formed in the opening, and thereby the eaves portion is formed on the over-etched portion described above.

In the manufacturing method of a semiconductor device according to the technology described above, it is desirable to form a metal layer made of the underlying metal layer and the main metal layer according to the forming of the under metal layer and the forming of the main metal layer by a semi-additive method.

The semi-additive method is a method which is advantageous for micro machining.

According to the present technology, a semiconductor device in which a predetermined metal layer is disposed between a pad electrode and a solder bump can prevent the lowering of reliability in an electrical and mechanical connection between semiconductor electronic components while suppressing the lowering of mass productivity and an increase in cost.

DETAILED DESCRIPTION OF EMBODIMENTS

Hereinafter, an embodiment according to the present technology will be described.

A description will proceed in a following order.

1. A semiconductor device and a manufacturing method of an embodiment
   1-1. The configuration of a semiconductor device
   1-2. The manufacturing method as a preceding example
   1-3. Problems in the preceding example
   1-4. The manufacturing method of an embodiment
   1-5. Summary of embodiment
2. Modification example
3. The present technology

1. SEMICONDUCTOR DEVICE AND A MANUFACTURING METHOD OF AN EMBODIMENT 1-1. The Configuration of a Semiconductor Device Hereinafter, an embodiment according to the present technology will be described referring to accompanying drawings.

Figure 1:
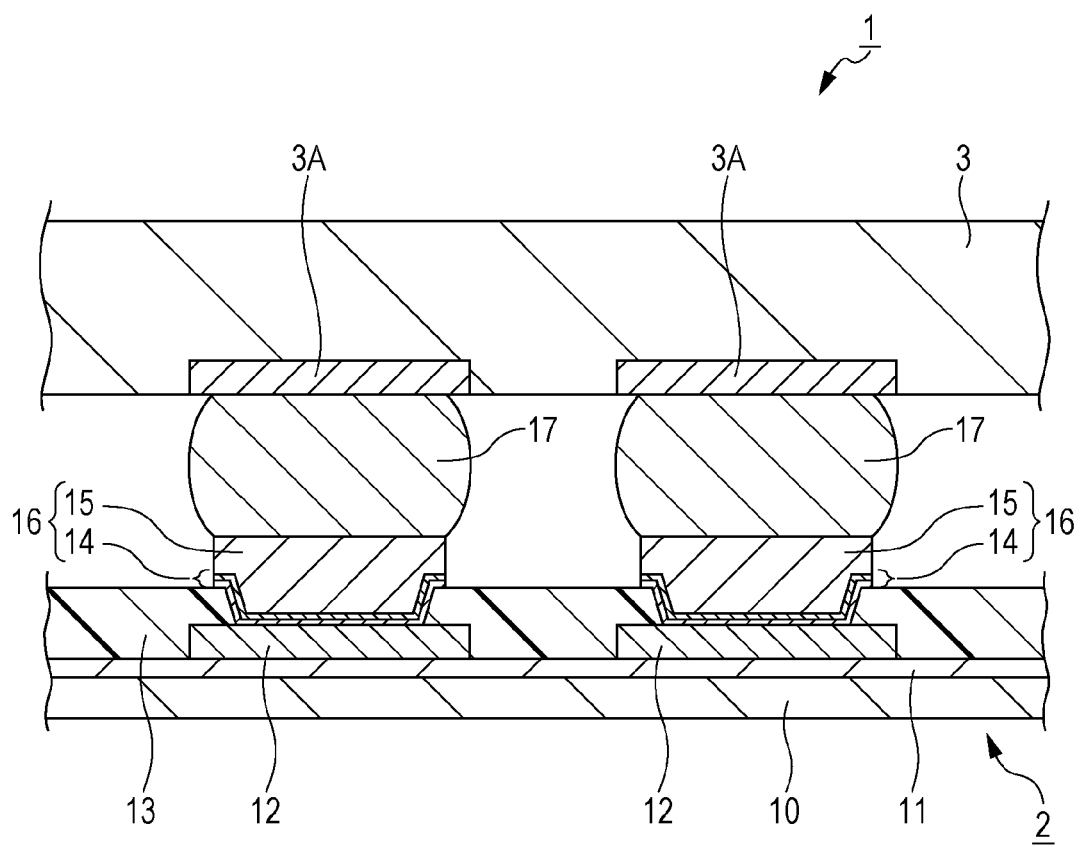
FIG. 1 is a schematic cross-sectional view of a semiconductor device according to an embodiment.

FIG. 1 is a schematic cross-sectional view of a semiconductor device 1 according to an embodiment.

First, as a premise, the semiconductor device 1 according to the embodiment is configured to have a first semiconductor electronic component and a second semiconductor electronic component bonded to the first semiconductor electronic component through solder bumps 17, 17, . . . , and 17. In FIG. 1, a bonding portion between semiconductor electronic components of the semiconductor device 1 is particularly enlarged and shown.

Semiconductor electronic components collectively refer to an electronic component including a semiconductor substrate.

In FIG. 1, the semiconductor device 1 includes a mounting substrate 2 as a first semiconductor electronic component, and a semiconductor chip 3 as a second semiconductor electronic component. These are electrically and mechanically connected to each other through the solder bumps 17, 17, . . . , and 17.

In the example, mounting of the semiconductor chip 3 onto the mounting substrate 2 is performed by a so-called flip chip method. In addition, as a so-called microbump, a formation pitch between the solder bumps 17, 17, . . . , and 17 is set to 100 μm or less. In the example, the formation pitch between the solder bumps 17, 17, . . . , and 17 is set to approximately 50 μm to 70 μm, and a diameter of the solder bumps 17, 17, . . . , and 17 is set to approximately 30 μm.

The mounting substrate 2 includes a semiconductor substrate 10, a multilayer wiring film 11, pad electrodes 12, 12, . . . , and 12, a passivation film 13, under-bump metals (UBM) 16, 16, . . . , and 16, and the solder bumps 17, 17, . . . , and 17.

The semiconductor substrate 10 is set to, for example, a Si substrate, and the multilayer wiring film 11 is formed on the semiconductor substrate 10. The multilayer wiring film 11 is provided for wiring between an element such as a transistor and the like formed on the semiconductor substrate 10 and the pad electrodes 12, 12, . . . , and 12, and is formed by stacking a wiring layer and an insulating layer on each other.

The pad electrodes 12, 12, . . . , and 12 are configured to include, for example, an Al-based material, and are formed on a predetermined position on the multilayer wiring film 11, respectively.

In addition, the passivation film 13 is formed on the multilayer wiring film 11. Pad openings 12K, 12K, . . . , and 12K are formed on positions of the passivation film 13 corresponding to formation positions of the pad electrodes 12, 12, . . . , and 12. These pad openings 12K, 12K, . . . , and 12K are formed to reach corresponding pad electrodes 12, 12, . . . , and 12, respectively.

The UBMs 16, 16, . . . , and 16 are formed to have a portion thereof positioned in the pad openings 12K, 12K, . . . , and 12K, and are bonded to the pad electrodes 12, 12, . . . , and 12. As shown in the Figure, the UBMs 16, 16, . . . , and 16 include metal seed layers 14, 14, . . . , and 14 connected to the pad electrodes 12, 12, . . . , and 12, and the main metal layers 15, 15, . . . , and 15 formed on an upper layer of the metal seed layer 14, 14, . . . , and 14.

The solder bumps 17, 17, . . . , and 17 are formed on an upper layer of the UBMs 16, 16, . . . , and 16. That is, an individual solder bump 17 is electrically and mechanically connected to the pad electrode 12 through the UBM 16, respectively.

The semiconductor chip 3 is an integrated Circuit (IC) chip which includes a semiconductor substrate, and includes pad electrodes 3A, 3A, . . . , and 3A for being connected to the solder bumps 17, 17, . . . , and 17 formed on the mounting substrate 2 side. An illustration is not provided, however, the semiconductor chip 3 has a structure in which a multilayer wiring film is formed on the semiconductor substrate, and pad electrodes 3A, 3A, . . . , and 3A are formed on a predetermined position of the multilayer wiring film, respectively.

In the semiconductor device 1 of the example, the solder bumps 17, 17, . . . , and 17 and the pad electrodes 3A, 3A, . . . , and 3A are bonded to each other as shown in the figure. Accordingly, the mounting substrate 2 and the semiconductor chip 3 are electrically and mechanically connected to each other.

In the semiconductor device 1 according to the above-mentioned embodiment, the UBMs 16, 16, . . . , and 16 are disposed between the pad electrodes 12, 12, . . . , and 12 of the mounting substrate 2 and the solder bumps 17, 17, . . . , and 17. That is, a metal layer functioning as the UBM is disposed.

By these UBMs 16, 16, . . . , and 16, a degree of bonding adhesion between the pad electrodes 12, 12, . . . , and 12 and the solder bumps 17, 17, . . . , 17 is improved.

In the semiconductor device 1 according to the embodiment as described below, eaves portions 15A', 15A', . . . , and 15A' are formed on main metals 15, 15, . . . , and 15 of the UBM 16, 16, . . . , and 16, however, this is not illustrated in FIG. 1.

1-2. A Manufacturing Method as a Preceding Example

Hereinafter, a method of manufacturing the semiconductor device 1 will be described. First, prior to a description of a manufacturing method as an embodiment, the manufacturing method as a preceding example will be described referring to FIGS. 2A to 4B.

Figure 2A:
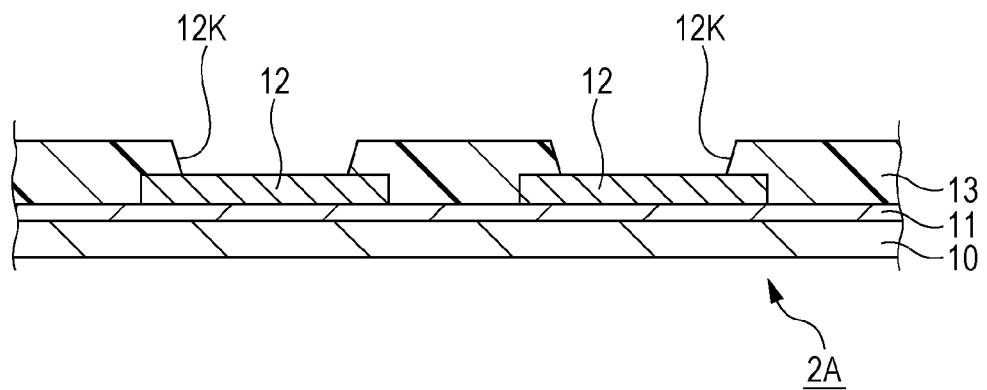
FIGS. 2A and 2B are schematic cross-sectional views for describing a method of manufacturing the semiconductor device as a preceding example.

First, in the manufacturing method as a preceding example, a structure as a substrate portion 2A as shown in FIG. 2A is obtained. That is, the pad electrodes 12, 12, . . . , and 12 are formed at a predetermined position on the multilayer wiring film 11, respectively, by forming the multilayer wiring film 11 on the semiconductor substrate 10. Then, the passivation film 13 is formed on the multilayer wiring film 11 with the pad electrodes 12, 12, . . . , and 12 formed thereon, and then, the pad openings 12K, 12K, . . . , and 12K are formed at positions corresponding to the formation positions of the pad electrodes 12, 12, . . . , and 12 of the passivation film 13. These pad openings 12K, 12K, . . . , and 12K are openings for exposing the pad electrodes 12, 12, . . . , and 12, and are formed by, for example, lithography and dry etching.

Here, a substrate portion 2A shown in FIG. 2A means a structure in which the UBMs 16, 16, . . . , and 16 and the solder bumps 17, 17, . . . , and 17 are removed from the mounting substrate 2 shown in FIG. 1.

Figure 2B:
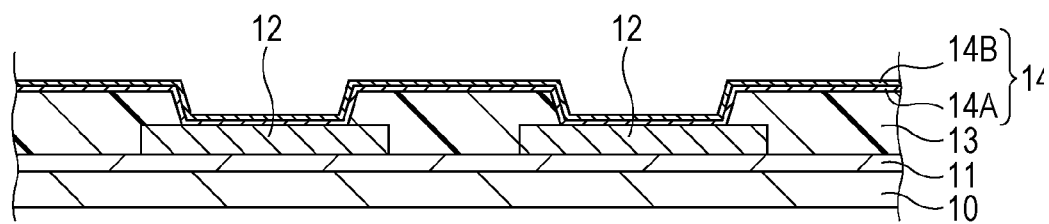

Next, as shown in FIG. 2B, the metal seed layer 14 is formed on the substrate portion 2A so as to be connected to the pad electrodes 12, 12, . . . , and 12. The metal seed layer 14 is formed by physical vapor deposition (PVD) or chemical vapor deposition (CVD) on the entire surface of a wafer from a viewpoint of ensuring reliability.

In a manufacturing method as a preceding example, two layers of a first layer 14A and a second layer 14B are formed as the metal seed layer 14. In a process of forming the metal seed layer 14, as the first layer 14A, for example, a Ti layer is first formed on the substrate portion 2A, and as the second layer 14B, for example, a Cu layer is formed on the first layer 14A.

Figure 3A:
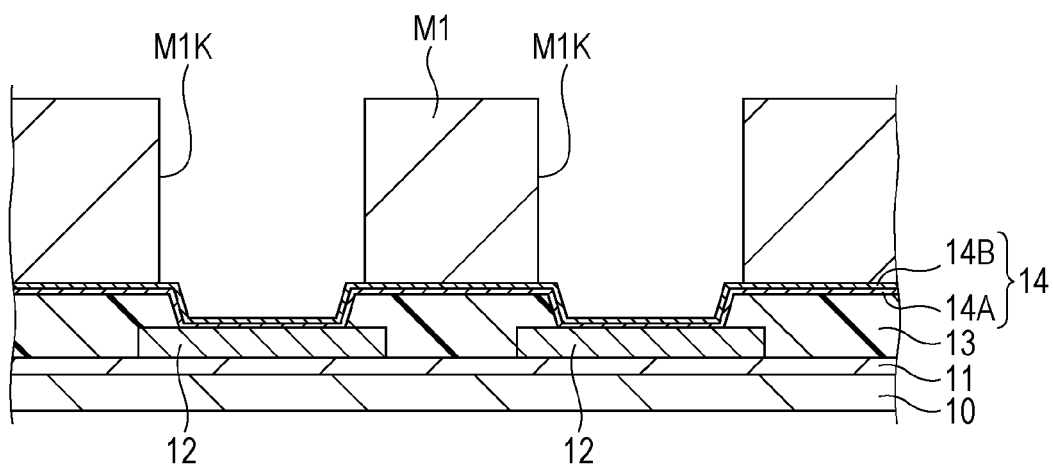
FIGS. 3A and 3B are also schematic cross-sectional views for describing the method of manufacturing the semiconductor device as a preceding example.

Furthermore, as shown in FIG. 3A, a mask M1 including openings M1K, M1K, . . . , and M1K is formed at positions corresponding to the formation positions of the pad electrodes 12, 12, . . . , and 12 on the metal seed layer 14. The mask M1 is formed by, for example, development and exposure of a photoresist.

Figure 3B:
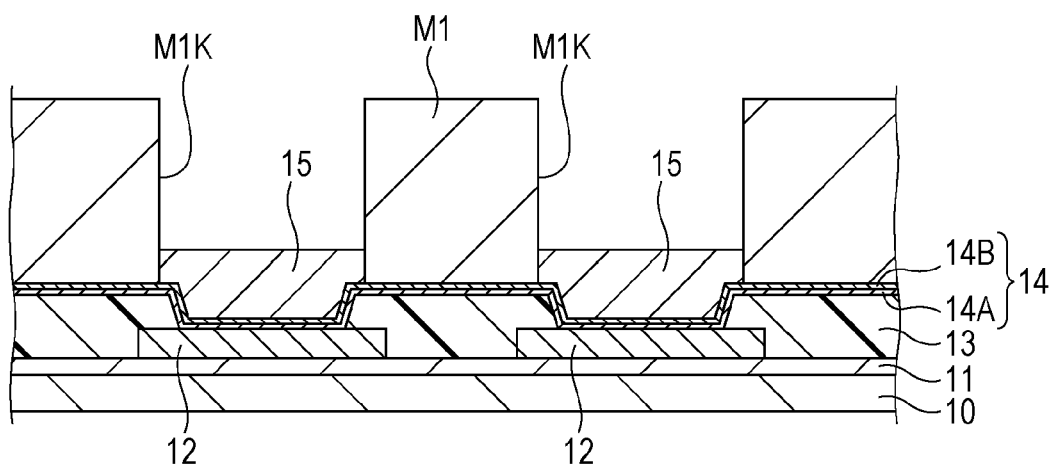

Subsequently, as shown in FIG. 3B, main metal layers 15, 15, . . . , and 15 are formed in the openings M1K, M1K, . . . , and M1K. In the example, the main metal layers 15, 15, . . . , and 15 are a Ni layer, and are formed by electrolytic plating. The electrolytic plating is performed using the metal seed layer 14 as an electrode layer. Accordingly, the main metal layers 15, 15, . . . , and 15 are formed on the metal seed layer 14.

At this time, when the second layer 14B which is a Cu layer is oxidized, an oxidized layer is removed by dilute sulfuric acid or plasma treatment before the plating.

Figure 4A:
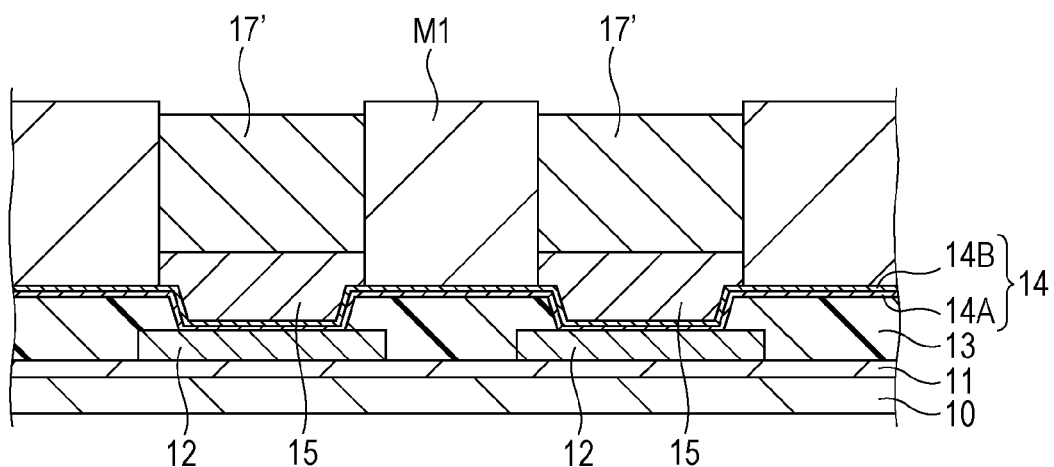
FIGS. 4A and 4B are also schematic cross-sectional views for describing a method of manufacturing the semiconductor device as a preceding example.

After forming the main metal layers 15, 15, . . . , and 15, solder layers 17', 17', . . . , and 17' are formed on the main metal layers 15, 15, . . . , and 15 as shown in FIG. 4A. In the example, a lead-free solder is used on the solder layers 17', 17', . . . , and 17'. More specifically, a Sn—Ag alloy (for example, Sn:Ag=97:3) is used thereon.

The formation of the solder layers 17', 17', . . . , and 17' is performed by an electrolytic plating which uses the metal seed layer 14 as an electrode.

Figure 4B:
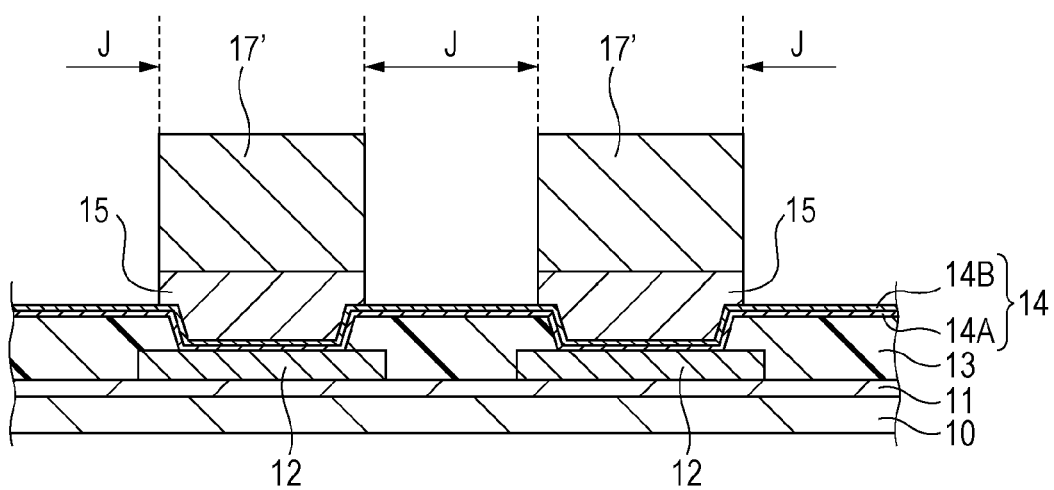

Next, as shown in FIG. 4B, a portion (indicated by the arrow of J in the figure) protruding from the main metal layers 15, 15, . . . , and 15 of the metal seed layer 14 is removed after removing the mask M1. The removal of the metal seed layer 14 is performed by wet etching by regarding the main metal layers 15, 15, . . . , and 15 as a mask. When the metal seed layer 14 remains as it is, the pad electrodes 12 are electrically connected to each other, so that the metal seed layer 14 is removed by regarding the main metal layers 15, 15, . . . , and 15 as a mask.

Although an illustration is not provided, the solder bumps 17, 17, . . . , and 17 are formed by performing a reflow after removing the metal seed layer 14 and melting the solder layers 17', 17', . . . , and 17'.

It is possible to deposit a flux layer so as to cover an entire surface including the solder layer 17', 17', . . . , and 17' and a protrusion portion of the main metal layers 15, 15, . . . , and 15. The flux layer is used to dissolve and remove the surface oxidized film of a solder bump electrode material as a reducing agent.

1-3. Problems in the Preceding Example

With respect to the above-described manufacturing method as the preceding example, since wet etching in the removal processing of the metal seed layer 14 is isotropic etching, so-called side etching also occurs. Therefore, in the removal processing, there is a possibility that over-etching as shown by a thick arrow in FIG. 5A may occur. That is, the removal of the metal seed layer 14 is not stopped just at a portion protruding from the main metal layer 15 but extends to a lower side of the main metal layer 15.

Here, after the metal seed layer 14 is removed as described above, solder configuring the solder layers 17', 17', . . . , and 17' by performing the reflow is melted.

Figure 5A:
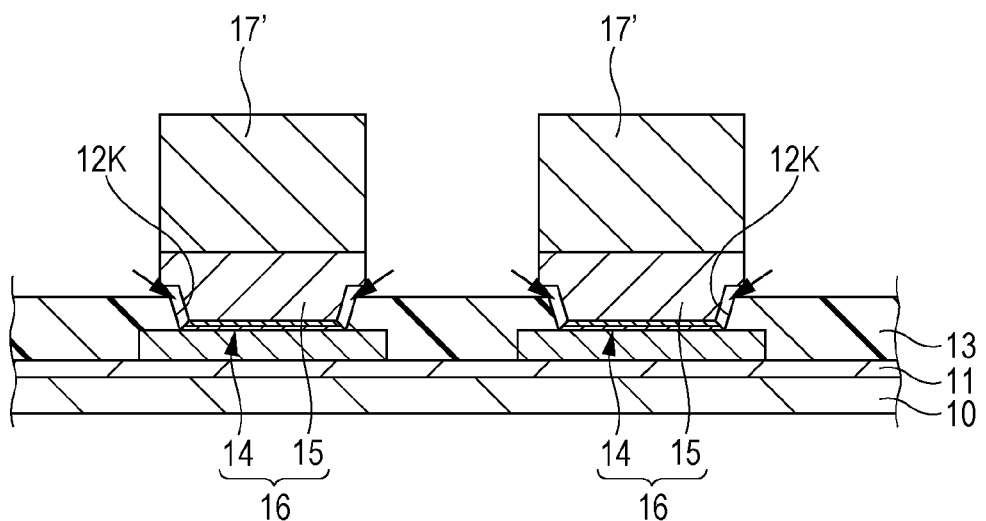
FIGS. 5A and 5B are schematic cross-sectional views for describing problems of the method of manufacturing the semiconductor device as a preceding example.
Figure 5B:
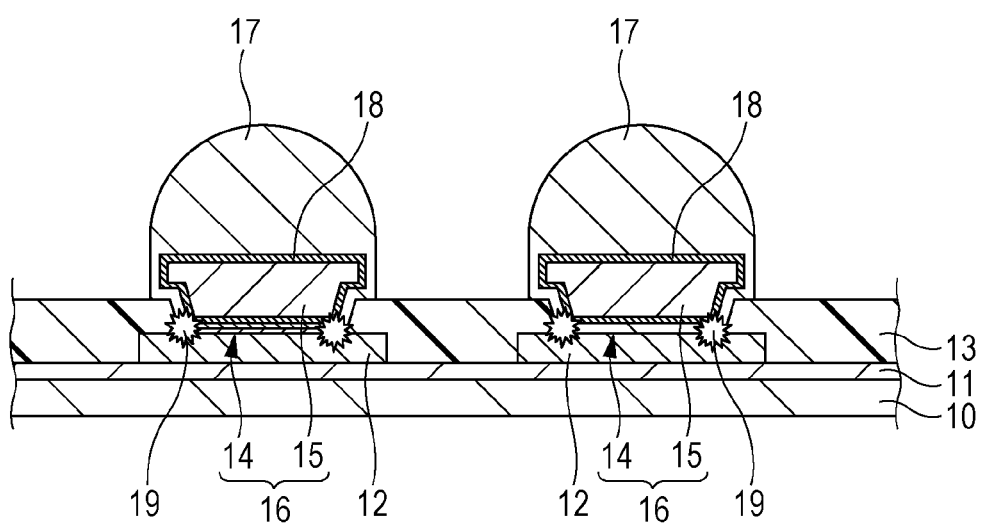

When over-etching, that is, over-etching reaching pad openings 12K, 12K, . . . , and 12K, as shown in FIG. 5A occurs, the solder melted along with the reflow leaks to a gap portion formed by over-etching as shown in FIG. 5B, and intermetallic compounds 18, 18, . . . , and 18 are formed in a region including a boundary portion between the leaked solder and the main metal layers 15, 15, . . . , and 15 (that is, a side wall portion of the pad openings 12K, 12K, . . . , and 12K).

When the intermetallic compound 18 is formed up to the side wall portion of each pad opening 12K in this manner, there is a possibility that metal corrosion shown as a corrosion portion 19 in the figure may occur in each pad electrode 12 configured to have an Al-based material. Then, when the corrosion portions 19, 19, . . . , and 19 occur, the bonding intensity between the intermetallic compound 18 and the pad electrodes 12, 12, . . . , and 12 is greatly lowered. Accordingly, there is a possibility that reliability in an electrical and mechanical connection between the mounting substrate 2 and the semiconductor chip 3 may be significantly lowered.

Figure 6A:
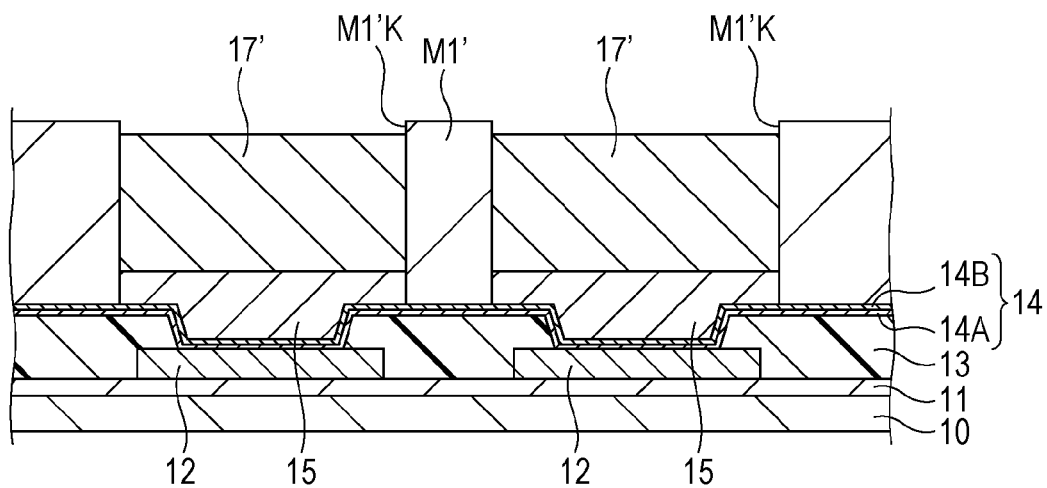
FIGS. 6A and 6B are schematic cross-sectional views for describing a technique of preventing corrosion from occurring at a UBM.

Here, in order to prevent the corrosion portions 19, 19, . . . , and 19 as shown in FIG. 5B from occurring, it is considered to adopt a technique of forming the main metal layers 15, 15, . . . , and 15 and the solder layers 17', 17', . . . , and 17' using a mask M1' shown in FIG. 6A, that is, a mask M1' having an opening M1'K which has a larger diameter than the opening M1K of the above mask M1.

Figure 6B:
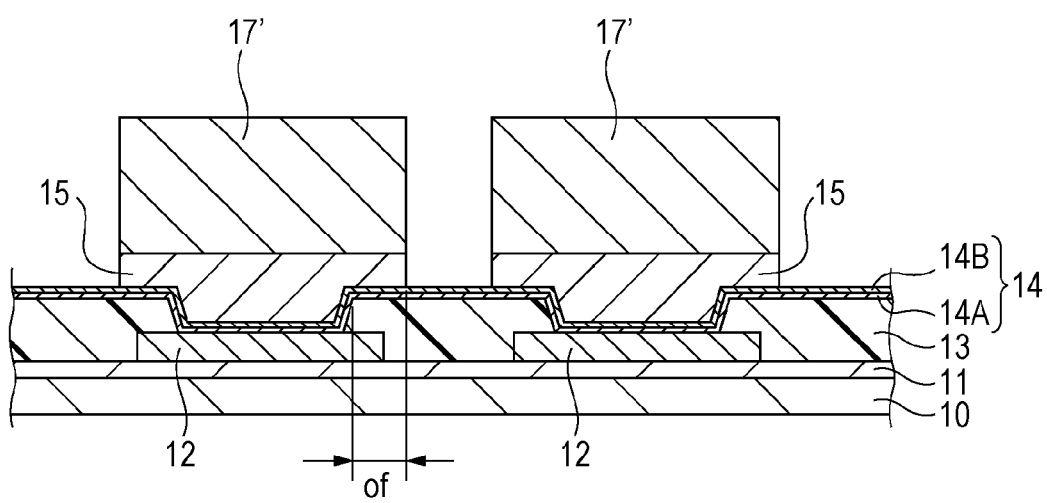

According to this technique, as the diameter of the opening M1'K gets larger, an amount of offset from a side wall portion of the pad opening 12K as shown in FIG. 6B can be larger, and thereby it is possible to prevent erosion of the metal seed layer 14 caused by over-etching from reaching the pad opening 12K.

However, according to the technique, the solder bumps 17, 17, . . . , and 17 result in an increase in diameter. In addition, accordingly, it is difficult to narrow a formation pitch of the solder bumps 17, 17, . . . , and 17.

Figure 7A:
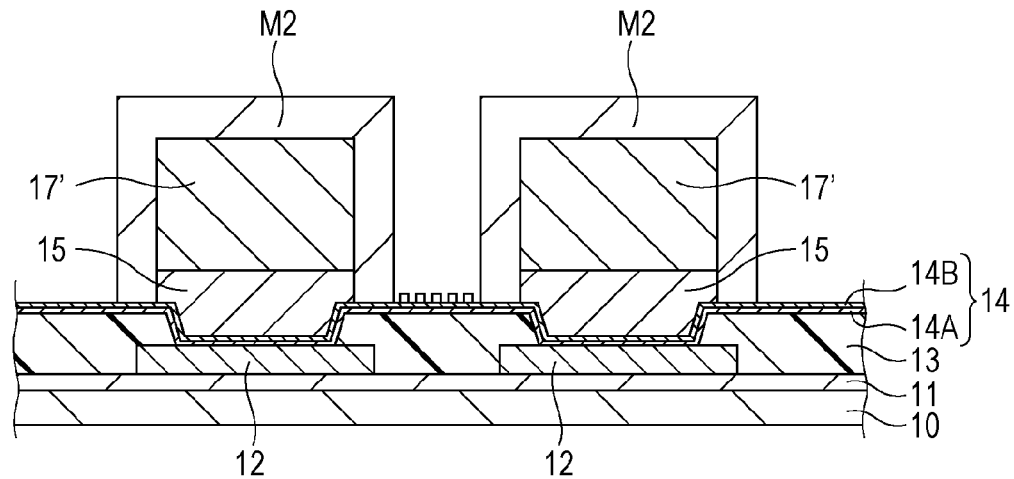
FIGS. 7A and 7B are schematic cross-sectional views for describing another technique of preventing corrosion from occurring at a UBM.

Alternatively, in order to prevent the corrosion portions 19 from occurring, it is considered to adopt a technique of forming masks M2, M2, . . . , and M2 covering a protrusion portion of the main metal layers 15, 15, . . . , and 15 and the solder layers 17', 17', . . . , and 17' as shown in FIG. 7A, and then performing etching on the metal seed layer 14.

Figure 7B:
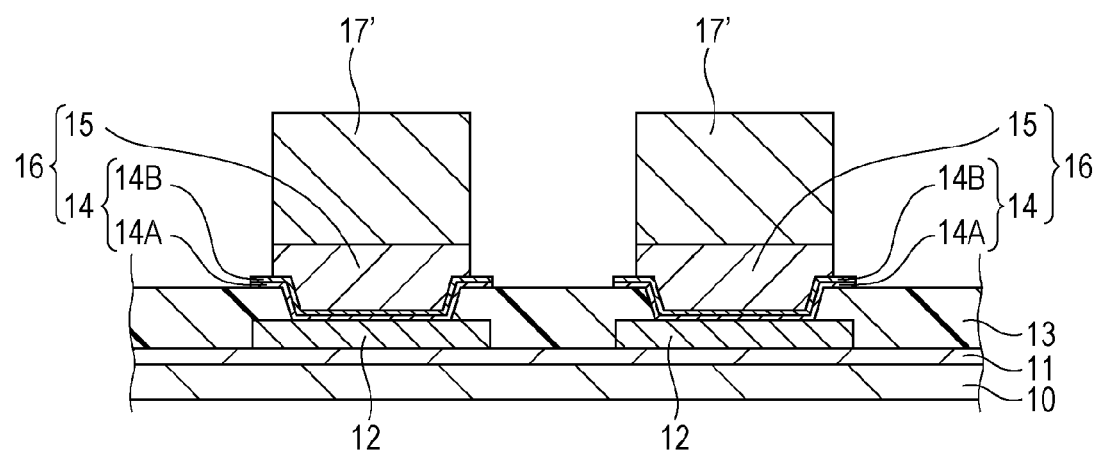

FIG. 7B shows a shape in which etching is performed using the masks M2, M2, . . . , and M2. However, it is understood by referring to this figure that over-etching may be prevented from reaching the pad openings 12K, 12K, . . . , and 12K even according to the technique.

However, when assuming a case of a narrow pitch like a microbump, there is a possibility that the patterning of the masks M2, M2, . . . , and M2 may become poor (because high resolution is necessary) in the technique shown in FIGS. 7A and 7B. When the patterning of the masks M2, M2, . . . , and M2 becomes poor as described above, etching of the metal seed layer 14 may cause a short circuit.

Moreover, when the patterning of the masks M2, M2, . . . , and M2 becomes poor, etching variation in the metal seed layer 14 occurs, and accordingly variation in a size (after reflow) of the UBMs 16, 16, . . . , and 16 occurs. As a result, this causes a change in a bump height, and thereby there is a concern that a problem may occur in a degree of bonding adhesion and the like.

Furthermore, an additional process of forming and removing the masks M2, M2, . . . , and M2 for preventing side etching is necessary, thereby leading to an increase in cost.

1-4. A Manufacturing Method of an Embodiment

Therefore, considering the above mentioned problems in the embodiment, a manufacturing method is proposed which will be described referring to FIGS. 8A to 11C below.

In the description below, the same portions as the portions already described in the preceding example will be given the same numerals, and description thereof will be omitted.

Figure 8A:
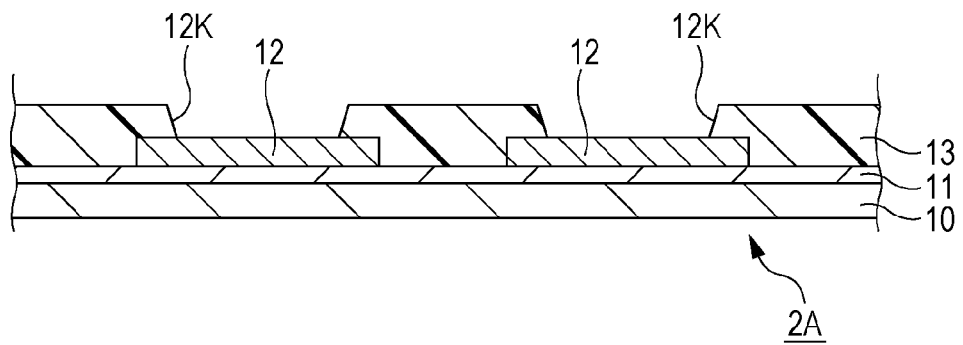
FIGS. 8A to 8C are schematic cross-sectional views for describing a method of manufacturing a semiconductor device as an embodiment.

First, as shown in FIG. 8A, the substrate portion 2A including the same pad openings 12K, 12K, . . . , and 12K as in FIG.

Figure 8B:
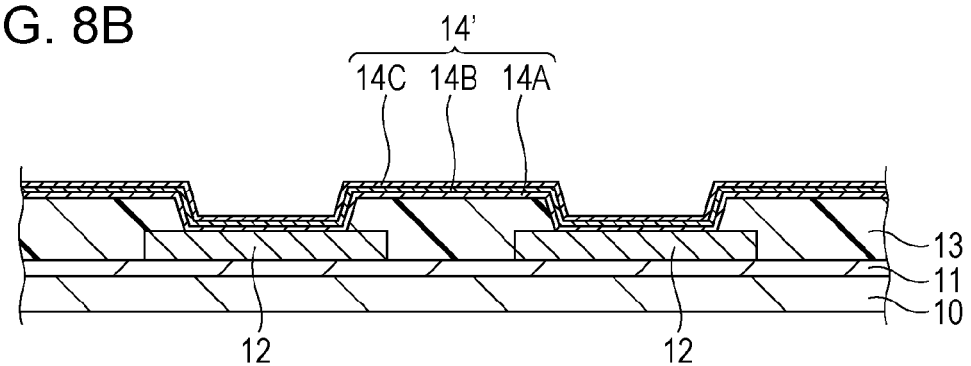

2A above is prepared, and then, the metal seed forming layer 14' is formed on the substrate portion 2A so as to be in contact with the pad electrodes 12, 12, ..., and 12 as shown in FIG. 8B. The metal seed forming layer 14' is a three-layered metal layer in which a first layer 14A and a second layer 14B are sequentially disposed from the bottom layer and a third layer 14C is disposed thereon as a top layer. The metal seed forming layer 14' is formed in an entire surface of a wafer in the same manner as the metal seed layer 14 by PVD or CVD.

In the example, a Ti layer is formed as the third layer 14C. Since the second layer 14B as described above is a Cu layer, the metal seed forming layer 14' is a metal layer in which the top layer and a layer under the top layer are configured to have different materials, respectively.

A thickness of the third layer 14C is, for example, 50 nm.

Figure 8C:
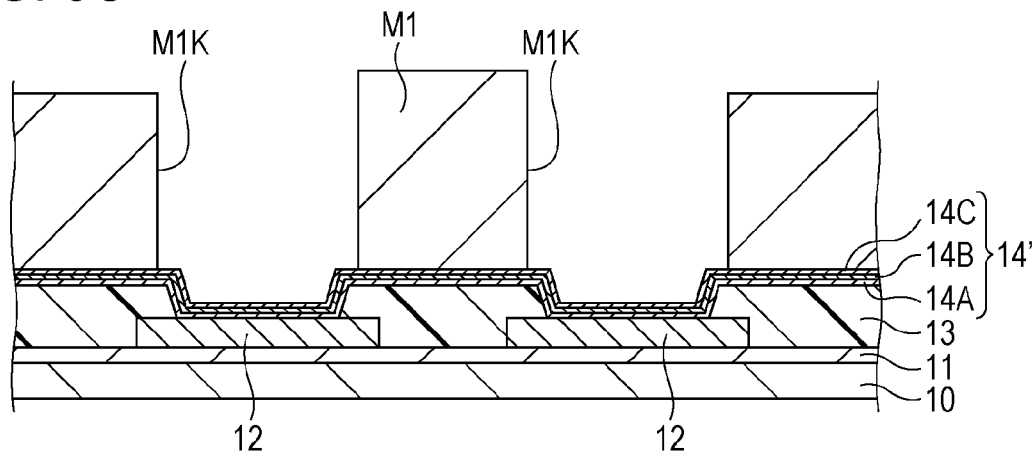

Next, as shown in FIG. 8C, the mask M1 having the same openings M1K, M1K, ..., and M1K as FIG. 3A above is formed on the metal seed forming layer 14'. A diameter of the openings M1K, M1K, ..., and M1K is the same as in the preceding example.

Figure 9A:
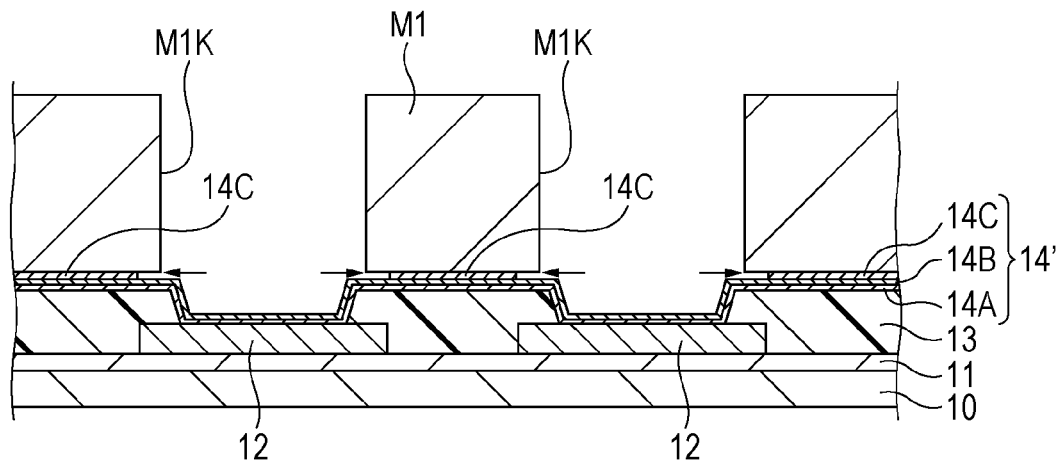
FIGS. 9A and 9B are also schematic cross-sectional views for describing the method of manufacturing a semiconductor device as an embodiment.

On the top thereof, as shown in FIG. 9A, the third layer 14C which is the top layer of the metal seed forming layer 14' is removed by wet etching. In order to prevent the second layer 14B (Cu layer) which is positioned as the layer under the third layer 14C (Ti layer) from being removed, a chemical solution which can perform etching selectively on the third layer 14C only is used herein.

Here, side etching (over-etching) as indicated by an arrow in the figure occurs due to the wet etching. That is, etching of the third layer 14C proceeds to a position beyond a side surface of openings M1K, M1K, ..., and M1K, and extends to the lower side of the mask M1.

Figure 9B:
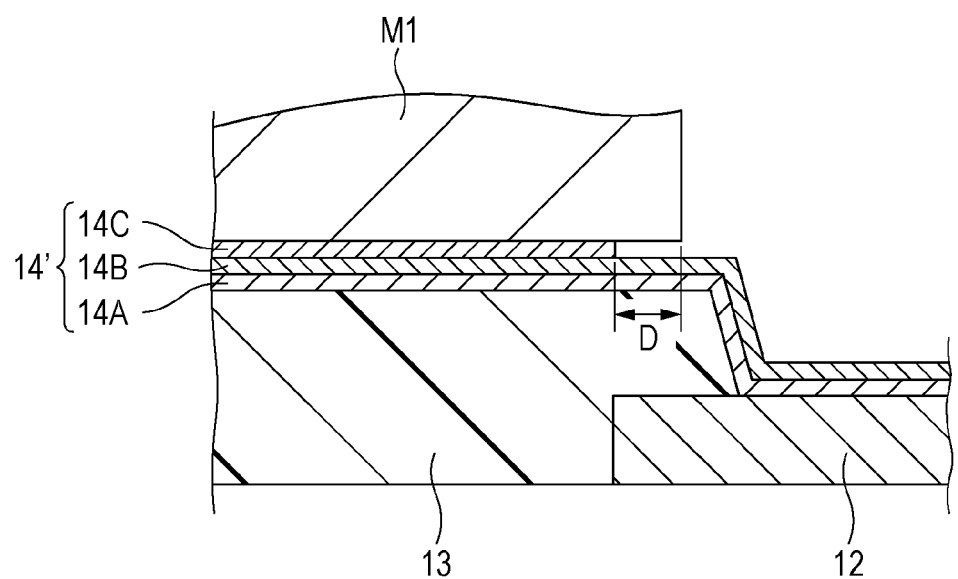

The length of a portion of the third layer 14C in which etching proceeds to the position beyond the side surface of the openings M1K, M1K, ..., and M1K by over-etching as described above is referred to as a length D as shown in an enlarged view of FIG. 9B.

Figure 10A:
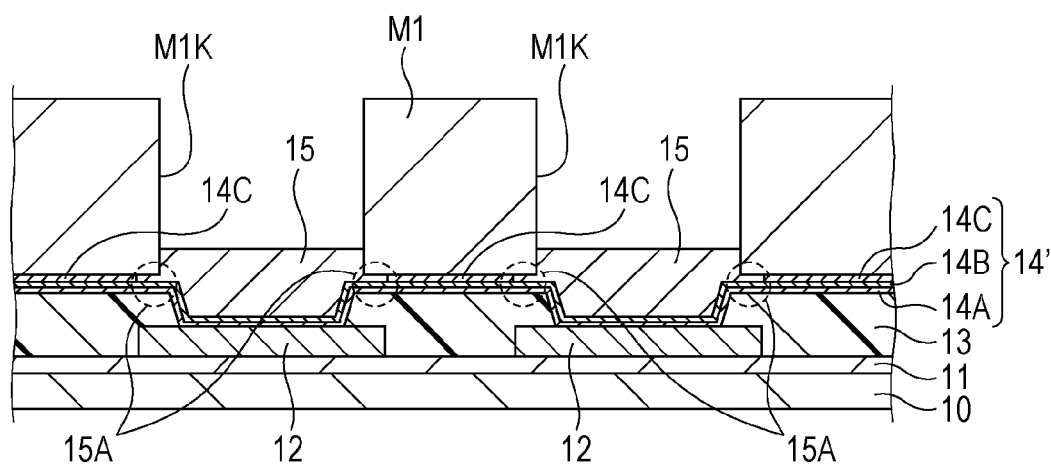
FIGS. 10A and 10B are also schematic cross-sectional views for describing the method of manufacturing a semiconductor device as an embodiment.

After performing etching on the third layer 14C, the main metal layers 15, 15, ..., and 15 are formed in the openings M1K, M1K, ..., and M1K as shown in FIG. 10A. More specifically, the main metal layers 15, 15, ..., and 15 are formed by electrolytic plating of Ni which uses the metal seed forming layer 14' as an electrode.

At that time, since the third layers 14C are over-etched by the length of D, eaves portions 15A protruding toward the outside are formed on an outer edge portion of individual main metal layers 15, respectively. A length of these eaves portions 15A, 15A, ..., and 15A in a protrusion direction is the same as the length D. From this point, the length of the eaves portions 15A, 15A, ..., and 15A in the protrusion direction is also referred to as the length D.

The length D of the eaves portions 15A, 15A, ..., and 15A can be easily controlled by the thickness of the third layer 14C and the chemical solution used in the wet etching.

The electrolytic plating of the above-mentioned main metal layers 15, 15, ..., and 15 and the wet etching of the third layer 14C described in FIGS. 9A and 9B are performed in continuous processing. Accordingly, oxidation of the second layer 14B is suppressed, and it is not necessary to remove an oxidized layer using dilute sulfuric acid, plasma treatment, or the like before electric field plating, thereby achieving a reduction in processes and shortening of the processing time, and prevention of an increase in cost.

Figure 10B:
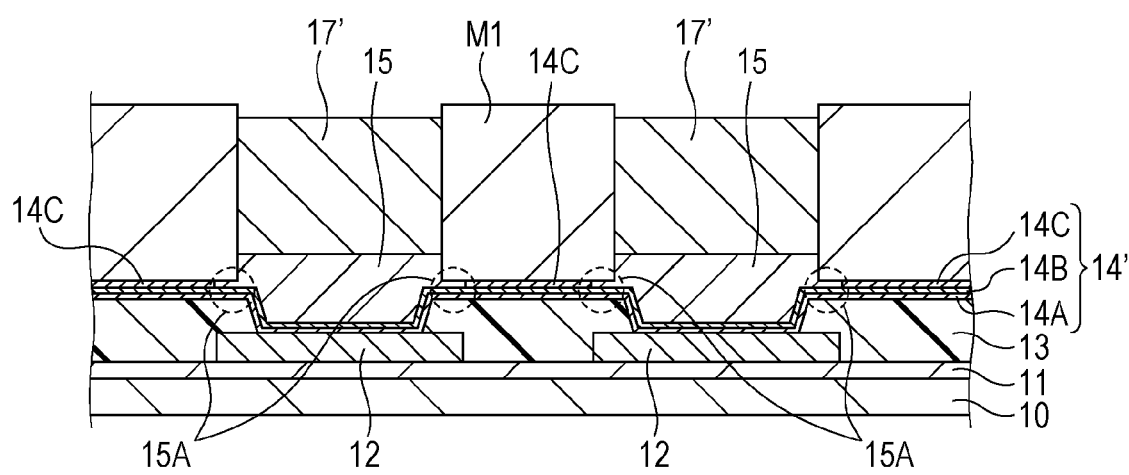

After forming the main metal layers 15, 15, ..., and 15, the solder layers 17', 17', ..., and 17' are formed as shown in FIG. 10B. These solder layers 17', 17', ..., and 17' are made from the same material as in the preceding example, and these solder layers are formed by electrolytic plating in the same manner as in the preceding example.

Figure 11A:
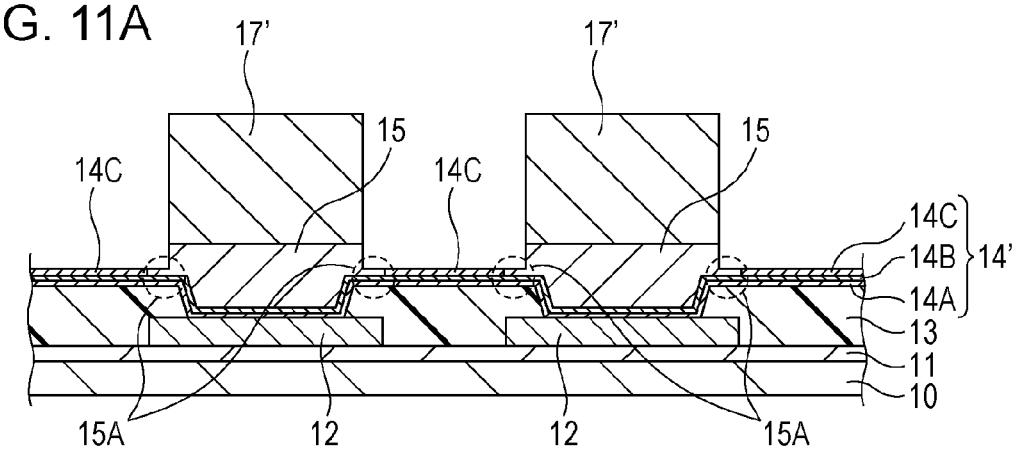
FIGS. 11A to 11C are also schematic cross-sectional views for describing the method of manufacturing a semiconductor device as an embodiment.
Figure 11B:
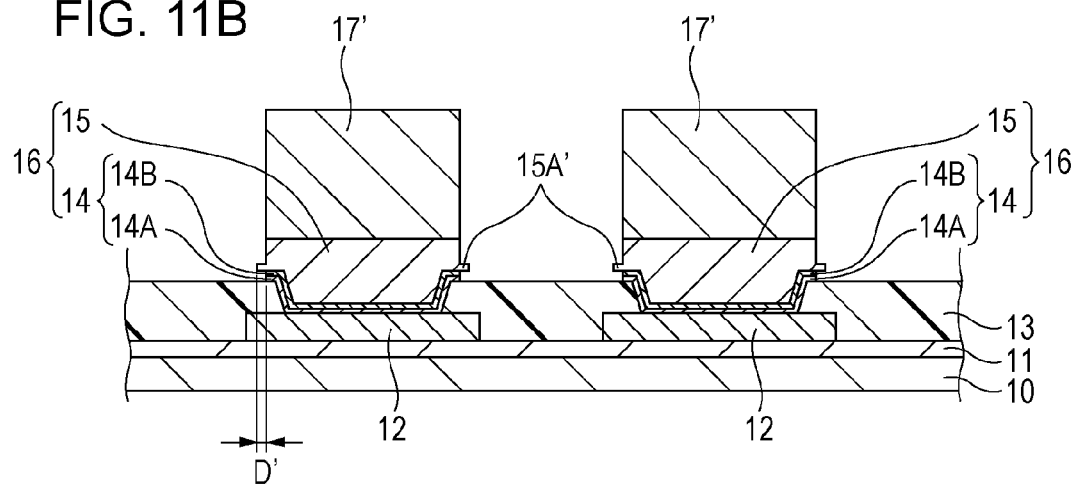

Next, after removing the mask M1 as shown in FIG. 11A, the main metal layers 15, 15, ..., and 15 are set to masks and the metal seed forming layer 14' is removed by wet etching as shown in FIG. 11B.

Here, wet etching in this case is performed based on a tip portion of the eaves portions 15A, 15A, ..., and 15A formed on the main metal layers 15, 15, ..., and 15. Accordingly, compared to the preceding example, an allowance amount of over-etching can be increased in proportion to the length D of the eaves portions 15A, 15A, ..., and 15A. Accordingly, it is possible to prevent over-etching from reaching the side wall portions of the pad openings 12K, 12K, ..., and 12K.

Figure 11C:
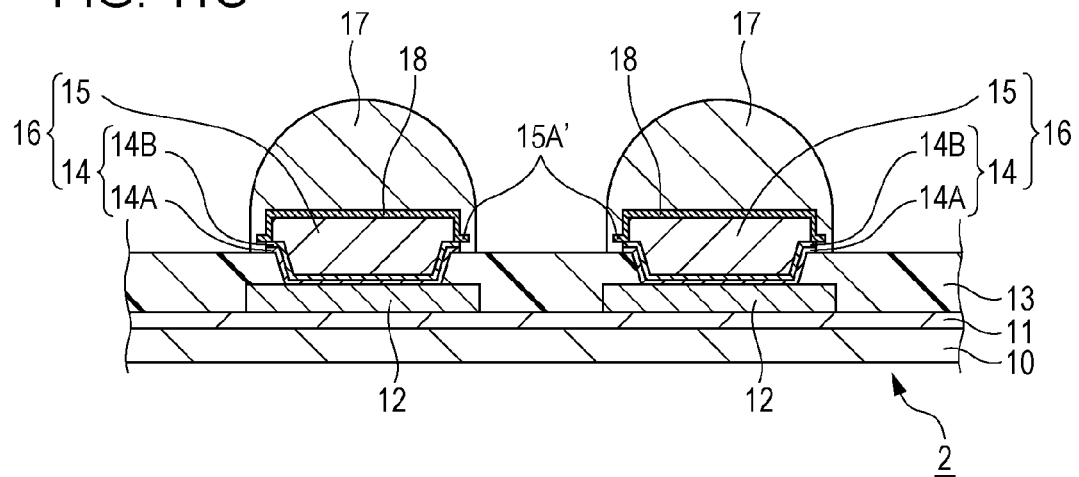

FIG. 11C shows a shape after reflow.

By preventing the over-etching from reaching the side wall portions of the pad openings 12K, 12K, ..., and 12K as described above, solder melted by reflow is prevented from flowing in the side wall portions of the pad openings 12K, 12K, ..., and 12K. Accordingly, the intermetallic compounds 18, 18, ..., and 18 are prevented from being formed up to the side wall portions of the pad openings 12K, 12K, ..., and 12K as shown in the case (FIG. 5B) of the preceding example.

Accordingly, it is possible to prevent the corrosion portions 19, 19, ..., and 19 from occurring at the pad electrodes 12, 12, ..., and 12, and to prevent the lowering of reliability in an electric and mechanical connection between the mounting substrate 2 and the semiconductor chip 3.

Here, in an etching process of FIG. 11B, a chemical solution which can etch both the metal seed forming layer 14' and the main metal layers 15, 15, ..., and 15 (that is, a chemical solution which can etch the eaves portions 15A, 15A, ..., and 15A), and has a slower etching rate on the eaves portions 15A, 15A, ..., and 15A than on the metal seed forming layer 14' is used.

Accordingly, a length D' of the eaves portions 15A', 15A', ..., and 15A' after etching is shorter than the length D.

At this time, as the length D of the eaves portions 15A, 15A, ..., and 15A before etching gets longer, it is possible to increase an allowance amount of over-etching. However, when the length D' of the eaves portions 15A', 15A', ..., and 15A' after etching is still long, a great amount of stress is over the eaves portions 15A', 15A', ..., and 15A' due to the solder melted by reflow.

By suppressing the length D' of the eaves portions 15A', 15A', ..., and 15A' using the chemical solution described above, it is possible to ease such stress. Accordingly, it is possible to prevent the lowering of reliability in an electrical and mechanical connection between semiconductor electronic components.

The length D of the eaves portions 15A, 15A, ..., and 15A may be set to the most appropriate length according to a diameter and a formation pitch of the solder bumps 17, 17, ..., and 17 (a length in which the over-etching does not reach the side wall portion of the pad openings 12K, 12K, ..., and 12K). In the example, the length D of the eaves portions 15A, 15A, ..., and 15A is set to 0.5 μm to 5 μm according to the diameter and the formation pitch of the solder bumps 17, 17, ..., and 17 described above.

At this time, the length D' of the eaves portions 15A', 15A', ..., and 15A' after etching is 0.1 μm to 2.5 μm.

By performing the etching process of FIG. 11B, the metal seed layers 14, 14, ..., and 14 are formed only at positions corresponding to the formation positions of the pad electrodes 12, 12, ..., and 12. The UBMs 16, 16, ..., and 16 shown in FIG. 1 are formed by these metal seed layers 14, 14, . . . , and 14 and the main metal layers 15, 15, . . . , and 15 formed in FIG. 11A.

The description by illustration is omitted, however, reflow is performed with the pad electrodes 3A, 3A, . . . , and 3A and the solder bumps 17, 17, . . . , 17 of the semiconductor chip 3 being in contact with each other after manufacturing the mounting substrate 2 shown in FIG. 11C using the technique described above, thereby mounting the semiconductor chip 3 on the mounting substrate 2. Accordingly, a semiconductor device 1 described in FIG. 1 above is manufactured.

1-5. Summary of Embodiment

In the embodiment described above, a formation process of an underlying metal layer which forms an underlying metal layer (metal seed forming layer 14') on the substrate portion 2A so as to be in contact with the pad electrodes 12, 12, . . . , and 12 formed on the substrate portion 2A including the semiconductor substrate 10, a formation process of a main metal layer which forms main metal layers 15, 15, . . . , and 15 at positions corresponding to the formation positions of the pad electrodes 12, 12, . . . , and 12 on the underlying metal layer, a solder layer formation process which forms the solder layers 17', 17', . . . , and 17' on the main metal layers 15, 15, . . . , and 15, and an underlying metal layer etching process which etches an underlying metal layer by regarding the main metal layers 15, 15, . . . , 15 as a mask are performed. Then, in the main metal layer formation process, the main metal layers 15, 15, . . . , and 15 including the eaves portions 15A, 15A, . . . , and 15A are formed on the outer edge portion.

Accordingly, the etching process is performed on the underlying metal layer based on the tip portion of the eaves portions 15A, 15A, . . . , and 15A formed on the main metal layers 15, 15, . . . , and 15, and an allowance amount of over-etching occurring in the etching process is increased in proportion to the length of the eaves portions 15A, 15A, . . . , and 15A.

Accordingly, the over-etching can be prevented from reaching the side wall portions of the pad openings 12K, 12K, . . . , and 12K, and the corrosion portions 19, 19, . . . , and 19 can be prevented from occurring, and thereby it is possible to prevent the lowering of reliability in an electric and mechanical connection between the semiconductor electronic components.

Here, in order to allow understanding from the foregoing description, in forming the eaves portions 15A, 15A, . . . , and 15A, a formation of the third layer 14C and an operation of etching on the third layer are added compared to a manufacturing method of the preceding example. The formation of the third layer 14C can be performed by a film forming process (PVD, CVD, and the like) in the same manner as the first layer 14A and the second layer 14B, and etching (wet etching) of the third layer 14C is completed in a few minutes. That is, an increase in a working load and working time necessary for the formation of the eaves portions 15A, 15A, . . . , and 15A can be made very small, such that it is possible to suppress the lowering of mass productivity and an increase in cost.

As described above, according to the embodiment, with respect to a semiconductor device in which a predetermined metal layer is disposed between the pad electrodes 12, 12, . . . , and 12 and the solder bumps 17, 17, . . . , and 17, it is possible to prevent the lowering of reliability in an electric and mechanical connection between the semiconductor electronic components while suppressing the lowering of mass productivity and an increase in cost.

In addition, the main metal layers 15, 15, . . . , and 15 are formed so as to set the length (length D) of the eaves portions 15A, 15A, . . . , and 15A in the protrusion direction to 0.5 μm to 5 μm in the embodiment.

The length D of the eaves portions 15A, 15A, . . . , and 15A before etching an underlying metal layer is appropriately set, and thereby the allowance amount of over-etching occurring in the etching process is approximately set. Accordingly, it is possible to prevent the lowering of reliability in an electrical and mechanical connection between the semiconductor electronic components.

Furthermore, in the underlying metal layer etching process of the embodiment, etching is performed by using a chemical solution which can etch both the underlying metal layer and the eaves portions 15A, 15A, . . . , and 15A, and has a slower etching rate on the eaves portions 15A, 15A, . . . , and 15A than on the underlying metal layer.

Accordingly, the eaves portions 15A, 15A, . . . , and 15A are also etched when etching is performed on the underlying metal layer, such that the length D' of the eaves portions 15A', 15A', . . . , and 15A' is shorter than the length D of the eaves portions 15A, 15A, . . . , and 15A. Therefore, the stress over the eaves portions 15A', 15A', . . . , and 15A' can be eased by the solder melted by reflow, and thereby the lowering of reliability in the electrical and mechanical connection between the semiconductor electronic components is prevented.

Furthermore, in the underlying metal layer formation process of the embodiment, an underlying metal layer in which the top layer (third layer 14C) and an underlying layer thereof (second layer 14B) are configured to have different materials, respectively, is formed, and the mask M1 including the openings M1K, M1K, . . . , and M1K at positions corresponding to formation positions of the pad electrodes 12, 12, . . . , and 12 is processed on the underlying metal layer, etching which selectively removes the top layer of the underlying metal layer is performed with the mask M1 processed, and then the main metal layers 15, 15, . . . , and 15 are formed in the openings M1K, M1K, . . . , and M1K in the main metal layer formation process.

The top layer of the underlying metal layer is over-etched to further outside than the openings M1K, M1K, . . . , and M1K of the mask M1 (refer to FIG. 9A). The main metal layers 15, 15, . . . , and 15 are formed in the openings M1K, M1K, . . . , and M1K in this state, and thereby the eaves portions 15A, 15A, . . . , and 15A are formed on the over-etched portion described above (refer to FIG. 10A).

By adopting such a technique, it is possible to form the eaves portions 15A, 15A, . . . , and 15A just by adding the formation of the third layer 14C and an operation of etching the third layer 14C compared to a manufacturing method of the preceding example. Accordingly, the lowering of reliability in the electrical and mechanical connection between semiconductor electronic components caused by providing the eaves portions 15A, 15A, . . . , and 15A can be prevented while suppressing the lowering of mass productivity and an increase in cost.

In addition, according to the technique, a diameter of the opening M1K of the mask M1 can be the same as in the preceding example. That is, like the technique described in FIGS. 6A to 7B above, it is not disadvantageous that the solder bumps 17, 17, . . . , and 17 have a small diameter and a narrow pitch. Therefore, according to the embodiment, even when the diameter and the formation pitch of the solder bumps 17, 17, . . . , and 17 become comparatively small, it is possible to provide an excellent manufacturing method realizing prevention of the lowering of reliability in the electrical and mechanical connection between semiconductor electronic components while suppressing the lowering of mass productivity and an increase in cost.

In addition, metal layers (UBMs 16, 16, ..., and 16) made from the underlying metal layer (metal seed layers 14, 14, ..., and 14) and the main metal layers 15, 15, ..., and 15 according to the underlying metal layer formation process and the main metal layer formation process are formed in a semi-additive method in the embodiment.

The semi-additive method is a method advantageous for micro machining. Therefore, the method is appropriate when the diameter and the formation pitch of the solder bumps 17, 17, ..., and 17 like in the embodiment are comparatively small.

Moreover, the semiconductor device 1 of the embodiment includes pad electrodes 12, 12, ..., and 12, solder bumps 17, 17, ..., and 17, and a first semiconductor electronic component (mounting substrate 2) having metal layers (UBMs 16, 16, ..., and 16) between a pad and solder formed between the pad electrodes 12, 12, ..., and 12 and the solder bumps 17, 17, ..., and 17. The metal layer between the pad and the solder is configured to have an underlying metal layer (metal seed layers 14, 14, ..., and 14) connected to the pad electrodes 12, 12, ..., and 12, and the main metal layer 15 formed on the underlying metal layer. Then, the semiconductor device 1 of the embodiment includes the main metal layer 15 which has eaves portions 15A', 15A', ..., and 15A' on the outer edge portion.

Provision of the eaves portions 15A', 15A', ..., and 15A' means that the amount of allowance of over-etching is increased in proportion to the length D of the eaves portions 15A, 15A, ..., and 15A before an etching process of the underlying metal layer. Therefore, according to the semiconductor device 1 of the embodiment, the lowering of reliability in the electrical and mechanical connection between semiconductor electronic components is prevented.

Moreover, since an increase in working load and working time necessary for forming the eaves portions 15A', 15A', ..., and 15A' as described above can be made very small, it is possible to suppress the lowering of mass productivity and an increase in cost.

From these points, according to the semiconductor device 1 of the embodiment, with respect to a semiconductor device in which a predetermined metal layer is disposed between the pad electrodes 12, 12, ..., and 12 and the solder bumps 17, 17, ..., and 17, it is possible to prevent the lowering of reliability in the electrical and mechanical connection between semiconductor electronic components while suppressing the lowering of mass productivity and the increase in cost.

In addition, the semiconductor device 1 of the embodiment includes a second semiconductor electronic component (semiconductor chip 3) which is electrically and mechanically connected to the first semiconductor electronic component through the solder bumps 17, 17, ..., and 17.

Accordingly, it is possible to realize the semiconductor device 1 in which semiconductor electronic components are electrically and mechanically connected to each other through the solder bumps 17, 17, ..., and 17.

Furthermore, the metal layer between the pad and the solder functions as an under-bump metal in the semiconductor device 1 of the embodiment.

Accordingly, a degree of bonding adhesion between the pad electrodes 12, 12, ..., and 12 and the solder bumps 17, 17, ..., and 17 can be improved.

Furthermore, the formation pitch of the solder bumps 17, 17, ..., and 17 is set to 100 μm or less in the semiconductor device 1 of the embodiment.

The formation pitch of the solder bumps 17, 17, ..., and 17 becomes a narrow pitch, and thereby the semiconductor device 1 can be made small.

In addition, the length (length D') of the eaves portions 15A', 15A', ..., and 15A' in the protrusion direction is set to 0.1 μm to 2.5 μm in the semiconductor device 1 of the embodiment.

The length of the eaves portions 15A', 15A', ..., and 15A' after etching the underlying metal layer is approximately set, and thereby stress is eased by the solder melted during reflow. Therefore, from these points, it is possible to prevent the lowering of reliability in the electrical and mechanical connection between semiconductor electronic components.

2. MODIFICATION EXAMPLE

As described above, an embodiment according to the technology is described, however, the technology is not limited to a detailed example as described above, and various modification examples are considered.

For example, a technique for forming the eaves portions 15A, 15A, ..., and 15A is not limited to the technique previously illustrated, and it is possible to adopt, for example, a technique shown in FIGS. 12A to 13C below.

Figure 12A:
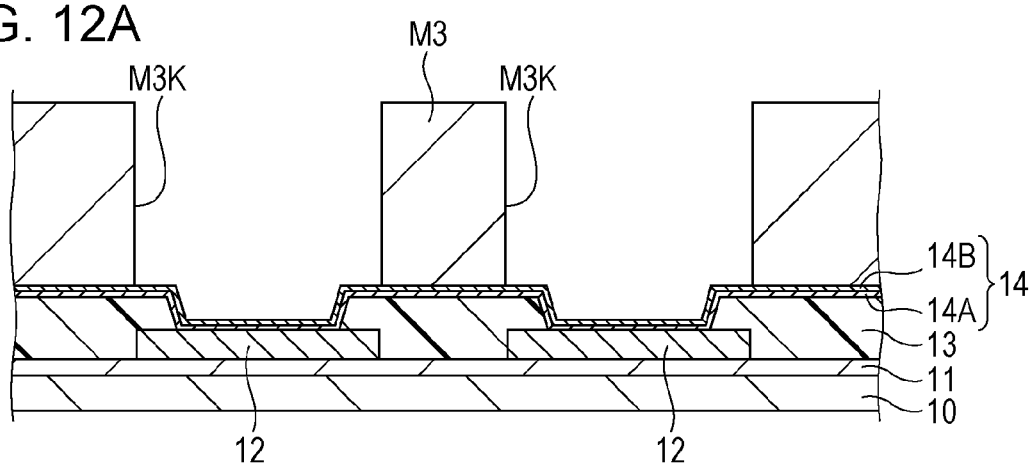
FIGS. 12A to 12C are schematic cross-sectional views for describing a technique of forming an eaves portion as a modification example.

First, in this case, the metal seed layer 14 (first layer 14A and second layer 14B) are formed on the substrate portion 2A in the same manner as in the preceding example, and a mask M3 including openings M3K, M3K, ..., and M3K is formed on the metal seed layer 14 (FIG. 12A). These openings M3K, M3K, ..., and M3K are formed at the same positions as the openings M1K, M1K, ..., and M1K of the mask M1 above, however, a diameter thereof is larger than the diameter of the openings M1K, M1K, ..., and M1K.

Figure 12B:
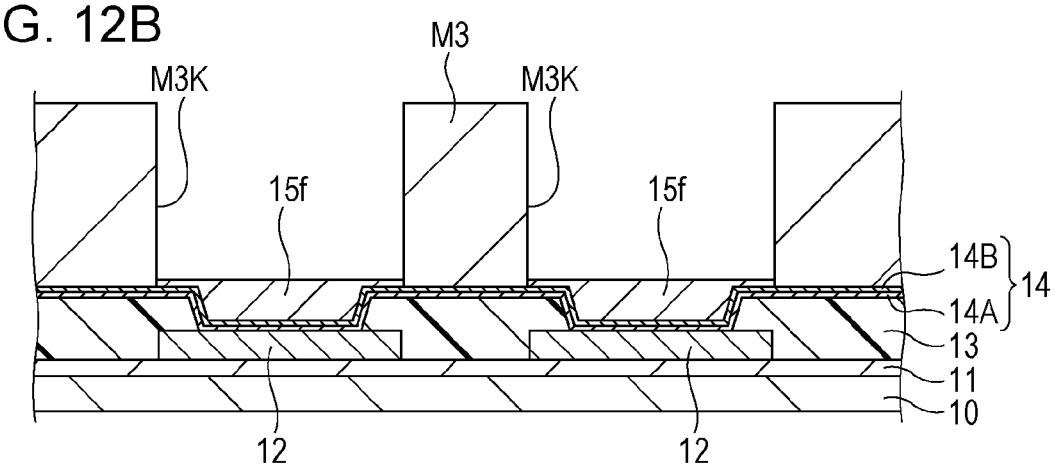
Figure 12C:
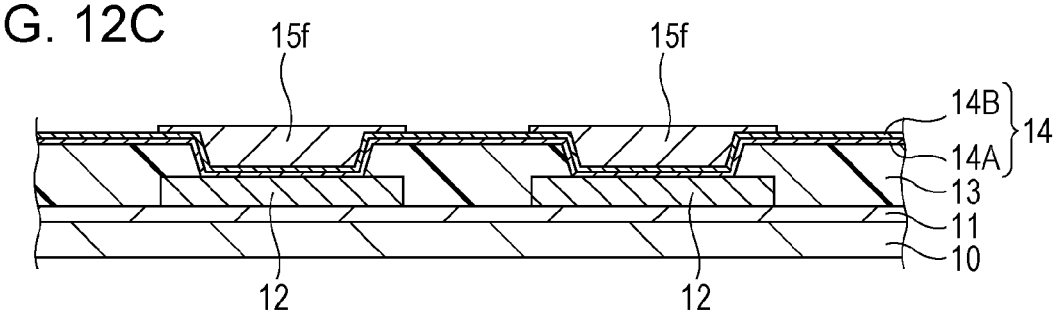

Next, main metal lower layers 15f, 15f, ..., and 15f are formed in the openings M3K, M3K, ..., and M3K (FIG. 12B). The main metal lower layers 15f, 15f, ..., and 15f are made from the same material (Ni) as the main metal layers 15, 15, ..., and 15, and the main metal lower layers are formed by electrolytic plating. These main metal lower layers 15f, 15f, ..., and 15f are formed to be lower than the main metal layers 15, 15, ..., and 15 in height.

Figure 13A:
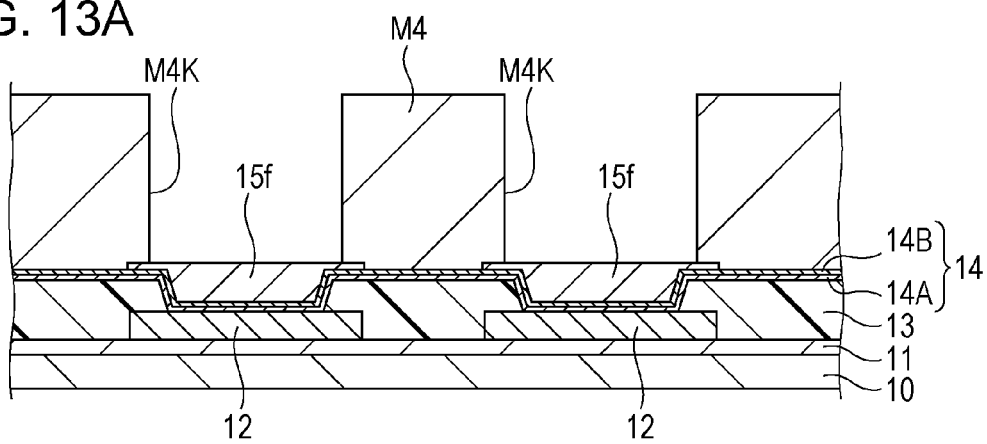
FIGS. 13A to 13C are also schematic cross-sectional views for describing the technique of forming an eaves portion as a modification example.

Furthermore, after removing the mask M3 (FIG. 12C), a mask M4 including openings M4K, M4K, ..., and M4K is formed (FIG. 13A). The openings M4K, M4K, ..., and M4K are formed at the same positions of the openings M1K, M1K, ..., and M1K of the mask M1, and a diameter thereof is the same as the diameter of the openings M1K, M1K, ..., and M1K.

Figure 13B:
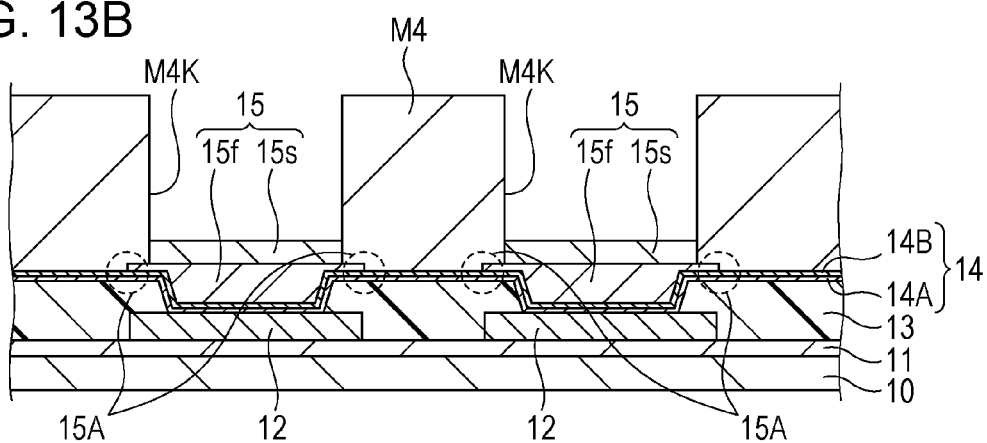

Next, main metal upper layers 15s, 15s, ..., and 15s are formed in the openings M4K, M4K, ..., and M4K (FIG. 13B). The main metal upper layers 15s, 15s, ..., and 15s are made from the same material (Ni) as the main metal layers 15, 15, ..., and 15, and formed by electrolytic plating. The main metal upper layers 15s, 15s, ..., and 15s are formed so that, for example, a height thereof becomes "the height of the main metal layer 15—the height of the main metal lower layer 15f".

Accordingly, in the same manner as when adopting the technique described in FIGS. 8A to 11C above, it is possible to form the main metal layers 15, 15, ..., and 15 which include the eaves portions 15A, 15A, ..., and 15A.

Figure 13C:
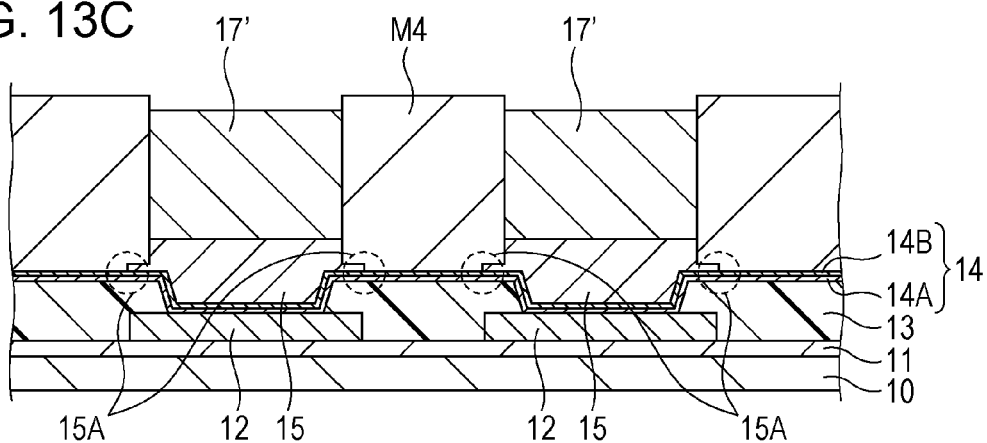

After forming the main metal upper layers 15s, 15s, ..., and 15s, the solder layers 17', 17', ..., and 17' are formed as shown in FIG. 13C, and then the semiconductor device 1 is manufactured in the same order as described in FIG. 11A and later figures.

According to a technique as the modification example, by adding a process of the formation and the removal of the mask M3 compared to the preceding example, a formation process of the main metal layers 15, 15, ..., and 15 is divided into two processes. Accordingly, according to the technique as the modification example, it is possible to prevent the lowering of reliability in the electrical and mechanical connection between semiconductor electronic components while suppressing the lowering of mass productivity and the increase in cost.

Moreover, in the technique as the modification example, the openings M4K, M4K, ..., and M4K of the mask M4 used in forming the solder layers 17', 17', ..., and 17' are the same as the openings M1K, M1K, ..., and M1K in diameter, so that it is not disadvantageous that the solder bumps 17, 17, ..., and 17 have a small diameter and a narrow pitch like the technique described in FIGS. 6A to 7B above. Therefore, according to the technique as the modification example, when the diameter and the formation pitch of the solder bumps 17, 17, ..., and 17 become comparatively small, it is possible to provide an excellent manufacturing method preventing the lowering of reliability in the electrical and mechanical connection between semiconductor electronic components while suppressing the lowering of mass productivity and the increase in cost.

Moreover, in the above description, an example according to bonding between the mounting substrate 2 and the semiconductor chip 3 is given, however, the technology can be widely and appropriately applied to, for example, bonding between semiconductor electronic components such as bonding between semiconductor chips, bonding between a wiring substrate as an interposer and the semiconductor chip, and the like.

In addition, it is illustrated that a metal layer functioning as a UBM is disposed between the pad electrodes 12, 12, ..., and 12 and the solder bumps 17, 17, ..., and 17, however, the technology can be appropriately applied even to when another metal layer other than the UBM is disposed.

Moreover, the main metal layers 15, 15, ..., and 15 can be made from not only Ni but also other metal materials such as Cu, Cr, and the like. In particular, a material which can be formed by the semi-additive method is desirable.

In addition, a material of the third layer 14C is not limited to Ti, and it is possible to use another material as long as the material is a material which can be etched in an isotropic manner by wet etching.

3. THE PRESENT TECHNOLOGY

The present technology can adopt a following configuration.

(1)
A semiconductor device which includes a first semiconductor electronic component that includes pad electrodes, solder bumps, and a metal layer between a pad and solder configured to have an underlying metal layer that is formed between the pad electrode and the solder bump and connected to the pad electrode, and a main metal layer that is formed on the underlying metal layer, and in which the main metal layer has eaves portions on the outer edge portion.

(2)
The semiconductor device described in (1) which includes a second semiconductor electronic component which is electrically and mechanically connected to the first semiconductor electronic component through the solder bump.

(3)
The semiconductor device described in (1) or (2) which has the metal layer between a pad and solder, which functions as an under-bump metal.

(4)
The semiconductor device described in any one of (1) to (3) which has a formation pitch of the solder bump which is set to 100 μm or less.

(5)
The semiconductor device described in any one of (1) to (4) which has a length of the eaves portion in a protrusion direction which is set to 0.1 μm to 2.5 μm.

(6)
A manufacturing method of the semiconductor device which includes an underlying metal layer formation process which forms an underlying metal layer on the substrate portion so as to be in contact with the pad electrode formed on the substrate portion including a semiconductor substrate, a main metal layer formation process which forms a main metal layer at a position corresponding to a formation position of the pad electrode on the underlying metal layer, a solder layer formation process which forms a solder layer on the main metal layer, and an underlying metal layer etching process which etches the underlying metal layer by regarding the main metal layer as a mask, and in which the main metal layer having eaves portions at an outer edge portion thereof is formed in the main metal layer formation process.

(7)
The manufacturing method of a semiconductor device described in (6), in which the main metal layer is formed so that a length of the eaves portion in the protrusion direction is 0.5 μm to 5 μm in the main metal layer formation process.

(8)
The manufacturing method of a semiconductor device described in (6) or (7), in which etching is performed by using a chemical solution which can etch both the underlying metal layer and the eaves portions, and has a slower etching rate on the eaves portions than on the underlying metal layer in the underlying metal layer etching process.

(9)
The manufacturing method of a semiconductor device described in any one of (6) to (8), in which an underlying metal layer whose top layer and a layer under the top layer are configured to have different materials, respectively, in the underlying metal layer formation process, and a mask having an opening at a position corresponding to a formation position of the pad electrode is processed on the underlying metal layer, etching which selectively removes the top layer of the underlying metal layer with the mask processed is performed, and then the main metal layer is formed in the opening in the main metal layer formation process.

(10)
The manufacturing method of a semiconductor device described in any one of the (6) to (9), in which, according to the underlying metal layer formation process and the main metal layer formation process, a metal layer made from the underlying metal layer and the main metal layer is formed by a semi-additive method.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a first semiconductor electronic component that includes a pad electrode, a passivation layer in which the pad electrode is embedded and with an opening in which the pad electrode is exposed, a solder bump, and a metal layer between the pad electrode and the solder bump, the metal layer comprising (a) an underlying metal layer including a first layer and a second layer between the pad electrode and the solder bump, the underlying metal layer being connected to the pad electrode, and (b) a main metal layer on the underlying metal layer,
wherein,
the metal layer overlies a major surfaced of the passivation layer,
a portion of the passivation layer overlies an edge of the pad electrode,
the main metal layer has an eave portion at an outer edge portion thereof, the eave portion projecting from a side of the main metal layer and projecting parallel both to a major surface of the pad electrode and the major surface of the passivation layer,
the eave portion is thinner than a central portion of the main metal layer that overlaps the pad electrode,
an edge portion of the eave portion projects in a first direction beyond an edge of the first layer and an edge of the second layer such that the edge portion of the eave portion is free from contact with the first layer and the second layer,
the edge portion of the eave portion projects in the first direction beyond the edge of the first layer and the edge of the second layer such that a gap exists between the edge portion of the eave portion and the passivation layer, and
the solder bump is in contact with the edge portion of the eave portion.

2. The semiconductor device according to claim 1, further comprising a second semiconductor electronic component which is electrically and mechanically connected to the first semiconductor electronic component.

3. The semiconductor device according to claim 1, wherein the metal layer functions as an under-bump metal.

4. The semiconductor device according to claim 1, wherein a formation pitch of the solder bump is set to 100 μm or less.

5. The semiconductor device according to claim 1, wherein a length of the eave portion in the first is set in a range of 0.1 μm to 2.5 μm.

6. The semiconductor device according to claim 1, wherein the eave portion overlaps a portion of the pad electrode.

7. The semiconductor device according to claim 1, further comprising an intermetallic compound layer between the solder bump and the main metal layer, the intermetallic compound layer being spaced from the first layer.

8. A method of manufacturing a semiconductor device, comprising:
forming a pad electrode on a substrate portion;
forming a passivation layer over the pad electrode with an opening that exposes a portion of the pad electrode while leaving an edge of the pad electrode overlaid by the passivation layer;
forming an underlying metal layer comprising a first layer and a second layer on the pad electrode, the first layer being in contact with the second layer and the pad electrode, the metal layer overlying a portion of a major surface of the passivation layer;
forming a main metal layer on the underlying metal layer;
forming a solder layer on the main metal layer;
etching the underlying metal layer by using the main metal layer as a mask; and
forming a solder bump by performing a reflow process on the solder layer,
wherein,
the main metal layer has an eave portion at an outer edge portion thereof, the eave portion projecting from a side of the main metal layer and projecting parallel both to a major surface of the pad electrode and a major surface of the passivation layer,
the eave portion is thinner than a central portion of the main metal layer that overlaps the pad electrode,
the first layer is spaced from the eave portion,
an edge portion of the eave portion projects in a first direction beyond an edge of the first layer and an edge of the second layer such that the edge portion of the eave portion is free from contact with the first layer and the second layer,
the edge portion of the eave portion projects in the first direction beyond the edge portion of the first layer and the edge portion of the second layer such that the edge portion of the eave portion is spaced from the passivation layer, and
the solder bump is in contact with the edge portion of the eave portion.

9. The method of manufacturing a semiconductor device according to claim 8, wherein the main metal layer is formed so that a length of the eave portion in the first direction is 0.5 μm to 5 μm.

10. The method of manufacturing a semiconductor device according to claim 8, wherein the etching is performed by using a chemical solution which can etch both the underlying metal layer and the eave portion and which has a slower etching rate on the eave portion than on the underlying metal layer in the etching of the underlying metal layer.

11. The method of manufacturing a semiconductor device according to claim 8, wherein:
in the forming of the underlying metal layer, the underlying metal layer is formed in which a third layer is formed on the first layer and the second layer, the underlying metal layer comprises different materials,
in the forming of the main metal layer, a mask having an opening at a position corresponding to a formation position of the pad electrode is processed on the underlying metal layer, and
the method further comprises:
etching to selectively remove at least a portion of the third layer of the underlying metal layer before the main metal layer is formed in the opening of the mask.

12. The method of manufacturing a semiconductor device according to claim 8, wherein a metal layer which is made of the underlying metal layer and the main metal layer by the forming of the underlying metal layer and the forming of the main metal layer is formed by a semi-additive method.

* * * * *